United States Patent [19]
Teverovsky et al.

[11] Patent Number: 5,453,233
[45] Date of Patent: Sep. 26, 1995

[54] METHOD OF PRODUCING DOMES OF ZNS AND ZNSE VIA A CHEMICAL VAPOR DEPOSITION TECHNIQUE

[75] Inventors: Alexander Teverovsky, Concord; James C. MacDonald, Stoneham, both of Mass.

[73] Assignee: CVD, Inc., Boston, Mass.

[21] Appl. No.: 42,942

[22] Filed: Apr. 5, 1993

[51] Int. Cl.[6] .................................................. C23C 16/00
[52] U.S. Cl. ........................ 264/81; 264/334; 264/336; 427/248.1; 427/255.5; 425/176; 425/441; 425/442; 118/728; 118/729; 118/500; 118/715
[58] Field of Search .................. 118/728, 729, 118/500, 715; 427/248.1, 255.5; 264/81, 334, 336; 425/176, 441, 442

[56] References Cited

U.S. PATENT DOCUMENTS

| | | | |
|---|---|---|---|
| 2,883,708 | 4/1959 | Sem | 264/81 |
| 3,793,984 | 2/1974 | Kasper | 264/81 |
| 3,895,084 | 7/1975 | Bauer | 264/81 |
| 4,823,736 | 4/1989 | Post et al. | 118/730 |
| 5,018,271 | 5/1991 | Bailey | 264/81 |
| 5,075,055 | 12/1991 | Finicle | 264/81 |
| 5,141,775 | 8/1992 | Patrigeon | 264/81 |
| 5,221,501 | 6/1993 | Feldman | 264/81 |

*Primary Examiner*—Richard Bueker
*Attorney, Agent, or Firm*—Mark F. LaMarre; Gerald K. White

[57] ABSTRACT

A method and device are provided for reducing the loss of CVD manufactured parts due to cracking caused by mechanical stresses resulting from the mismatch of the coefficient of thermal expansion between the chemical vapor deposed part and the mandrel plate. The method and device provide a removable mandrel support which is removed after the chemical vapor deposition but prior to the cooling of the CVD part and the mandrel plates. This permits the CVD part to contract upon cooling without mechanical restriction, thus reduce cracking caused by contraction of the CVD part against a mold which does not contract substantially.

14 Claims, 6 Drawing Sheets

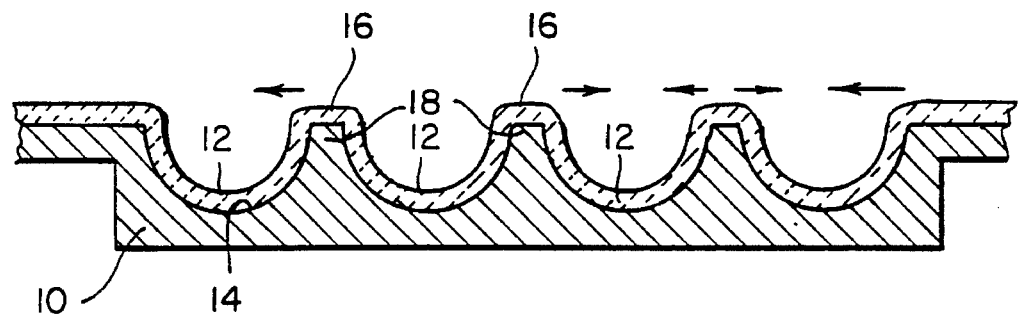
FIG. 1a
FIG. 4
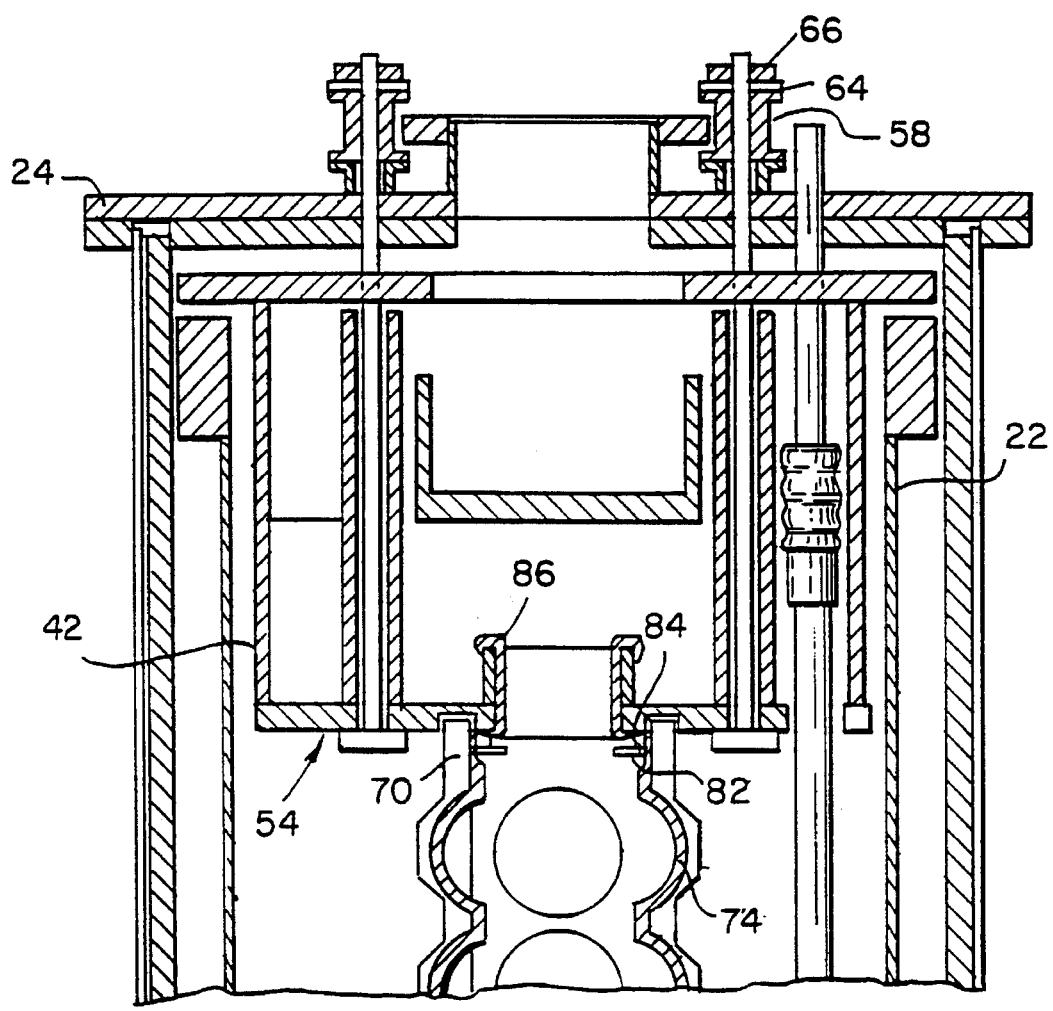

METHOD OF PRODUCING DOMES OF ZNS AND ZNSE VIA A CHEMICAL VAPOR DEPOSITION TECHNIQUE

BACKGROUND OF THE INVENTION

1. Field of the Invention

This invention relates to a process using chemical vapor deposition for the manufacture of multi-site curved surfaces, such as domes. In particular, this invention relates to an improvement in the process to reduce loss due to cracking caused by mechanical stresses resulting from the mismatch of the coefficients of thermal expansion (CTE) between the product and the mandrel plate.

2. Description of Related Art

Stress cracking of chemical vapor deposited CVD curved parts, such as domes, is due in part to the mismatch of the coefficients of thermal expansion (CTE) between the graphite forms and ZnS or ZnSe parts. Such cracking, if not prevented results in substantial loss (30% to 35%) due to damage to the manufactured parts.

In the manufacture of ZnS or ZnSe parts by chemical vapor deposition (CVD), a number of mandrel plates 10 are bolted together, as shown in FIG. 1. Typically four mandrel plates 10 are arranged in the form of a rectangular box. The mandrel plates 10 are normally made from graphite. A CVD furnace is charged with a zinc metal and the mandrel plates are placed in a CVD furnace. The furnace is then covered, sealed, and vacuum connections are attached in preparation for operation of the CVD process. The furnace is then heated to operating temperature (1200°–1300° F.) and a flow of reaction gas, $H_2S$ or $H_2Se$, and an inert carrier gas, such as argon, is initiated. The CVD process continues until a sufficient depth of material is deposited, after which the furnace is cooled (approximately 24 hours) and the mandrel plates 10 containing the CVD deposited parts are unbolted and the parts are removed from the furnace. The parts are examined for cracks and the general appearance. Parts which are not within specification are discarded.

During the cooling process the graphite mandrel plates 10 change dimension only slightly, while the CVD deposited ZnS and ZnSe change dimensions to a greater degree. For example, the coefficient of thermal expansion for ZnS and ZnSe is approximately three times that of graphite. The difference in the change in dimension due to the difference in the coefficients of thermal expansion (CTE) results in mechanical stresses in the ZnS and ZnSe parts. These stresses are most apparent in the manufacture of curved surfaces such as domes or bowls. As shown in FIG. 1a; CVD domes 12 are deposited on a graphite mandrel plate 10. The domes 12 engage the female section 14 of the mandrel plate 10. Bridges 16 of chemical vapor deposited material cover the male sections 18 of mandrel plates 10 and connect adjacent domes 12. During the cool-down of the mandrel plate 10 and CVD domes 12, the graphite from which the mandrel plate 10 is made contracts slightly, while the CVD dome 12 contracts at approximately three times the rate of the mandrel plate 10. It is believed the mechanical stresses or "pinning" which is caused by the contraction of the material of the domes 12 and the bridge section 16 cause the deposited material to be pulled apart. The mechanical stresses appear in the finished part in the form of small cracks.

Normally, the loss due to stress cracking is from 30% to 35%, however, the loss may run as high as 90% under certain circumstances. The reduction or elimination of the effect of the difference in the coefficient of thermal expansion on the ZnS and ZnSe parts would result in a significant reduction in the percentage of loss. The difficulty in solving this problem is increased by the significant mass of the mandrel plates, CVD deposited parts, and the furnace, in addition to the high temperature at which a CVD furnace operates. Further, the inability to access the CVD deposited parts and mandrel plates immediately after completion of the CVD process adds to the difficulty in solving the problem.

SUMMARY OF THE INVENTION

An object of this invention is to provide a method and a device which reduce the stress cracking associated with the difference in the coefficients of thermal expansion (CTE) between the CVD deposited parts and the mandrel plates during the cooling phase of the CVD process.

Another object of this invention is to provide a method and a device which reduce the mechanical stresses placed on the CVD deposited parts by the mandrel plates during the cooling phase of the CVD process.

Another object of this invention is to provide a method and a device which separate the mandrel plates from the CVD deposited parts after deposition and prior to the cooling process while maintaining the CVD furnace at normal operating conditions.

Another object of this invention is to provide a method and a device which reduce the mechanical stresses on the CVD deposited parts during the cooling process without significant modification to the CVD process or equipment.

These and other objectives of the invention, which will become apparent from the following description, have been achieved by a novel method for the manufacture of chemical vapor deposited structures, whereby the mandrel plates used in the manufacture of the CVD part are held together by a removable support means. The removable support means are removed after the deposition process and prior to significant cooling of the mandrel plates and the CVD parts, thereby permitting the deposited material to contract without mechanical restriction.

The method comprises placement of a plurality of mandrel plates into a chemical vapor deposition furnace. The mandrel plates used with this invention contain multi-site curved surfaces. The mandrel plates are made from a material suitable for use in a chemical vapor deposition furnace. The furnace has a plurality of side walls, a top cover and a bottom cover. Each of the mandrel plates has a top end, a bottom end, and side edges. The bottom ends of the mandrel plates are placed in a base member; the base member retaining the mandrel plates in substantially rigid position. However, the mandrel plates are permitted to move slightly so as to accommodate a movement of approximately two inches at the top of the mandrel plates. The mandrel plates are then secured by removable support means which maintain each of the mandrel plates in a first form position wherein the side edges of the mandrel plates are retained in close proximity to one another. Preferably, the top ends of the mandrel plates are secured by the removable support means. The chemical vapor deposition furnace is then heated to the operating temperature. The mandrel plates are moved into a second form position due to thermal expansion of the material from which the mandrel plates are manufactured. A second support means is provided which permits limited movement of the top ends of the mandrel plates to a third form position. The second form position is intermediate between the first form position and the third form position.

Material is then deposited on the mandrel plates by chemical vapor deposition. At the completion of the deposition process, the removable support means are removed thus permitting the mandrel plates to move from the second form position to the third form position. The mandrel plates are free to move from the chemical vapor deposited material, thereby permitting the deposited material to contract without mechanical restriction.

The removable support means can be in the form of a movable top plate which moves from a first position, wherein the top ends of the mandrel plates are retained in close proximity to one another, and a second position which permits the top ends of the mandrel plates to move freely to a third form position.

The removable support means can also be a rupturable fastener means which secures the top ends of the mandrel plates in a first form position wherein the mandrel plates are retained in close proximity to one another. When a sufficient amount of force is applied the rupturable fastener means breaks thereby removing the removable support means. The top ends of the mandrel plates are then permitted to move freely to a third form position.

The second support means can be a flexible attachment means attached between the first edge and the second edge of corresponding mandrel plates. Also, the second support means can be a continuous band which encircles the mandrel plates. Alternatively, the second support means can be in the form of a plurality of support posts attached to the base member of the mandrel plate or to the bottom cover of the furnace.

This invention also includes a device for the manufacture of chemical vapor deposition deposed structures. The device is a CVD furnace and associated hardware comprising a plurality of mandrel plates in a chemical vapor deposition furnace. The mandrel plates are made from a material suitable for use in a chemical vapor deposition furnace. The furnace has a plurality of side walls, a top cover and a bottom cover, each of the mandrel plates having a top end, a bottom end, and side edges. A base member is provided for placement of the bottom ends of the mandrel plates. The base member retains the mandrel plates in substantially rigid positions. However, the mandrel plates are permitted to move slightly so as to accommodate a movement of approximately two inches at the top of the mandrel plates.

A removable support means for securing the mandrel plates is provided which maintains each of the mandrel plates in a first form position. The side edges of each of the mandrel plates forms are retained in close proximity to one another. Prior to initiating the chemical vapor deposition process the CVD furnace is heated and the mandrel plates are moved into a second form position by the thermal expansion of the material from which the mandrel plates are manufactured. A second support means is provided which permits limited movement of the top ends of the mandrel plates to a third form position.

After a structure is deposited by chemical vapor deposition, the removable support means for securing the top ends of the mandrel plates is removed. This permits the mandrel plates to move from the second form position to the third form position, such that chemical vapor deposed material is freed from the mandrel plates, thereby permitting the material to contract without mechanical restriction.

The removable support means can be a movable plate which moves from a first position securing the top ends in a first form position when the mandrel plates are cool and a second form position when the mandrel plates are heated. The mandrel plates are retained in close proximity to one another until the movable plate is moved to a second position which permits the top ends of the mandrel plates to move freely to a third form position. Also, the removable support means can be a rupturable fastener means which secures the top ends of the mandrel plates in a first form position which retains the mandrel plates in close proximity to one another. After application of a sufficient amount of force the rupturable fastener means breaks thereby removing the removable support means thereby permitting the top ends of the mandrel plates to move freely to a third form position.

The second support means can be in the form of a flexible attachment means attached between the first edge and the second edge of corresponding mandrel plates. Also, the second support means is a continuous band which encircles the mandrel plates. Further, a plurality of support posts attached to the base member can be used as a second support means. These support posts can also be attached to the bottom cover of the furnace.

BRIEF DESCRIPTION OF THE DRAWINGS

With this description of the invention, a detailed description follows with reference being made to the accompanying figures of drawings which form part of the specification related thereto, in which like parts are designated by the same reference numbers, and of which:

FIG. 1a is a cross-sectional view of a mandrel plate upon which is deposited material by the CVD process illustrating the effect of the difference in the coefficient of thermal expansion between the material from which the mandrel plate is made and the material which is deposited;

FIG. 4 is a cross-sectional view of the top portion of a CVD furnace illustrating the first embodiment of this invention with a shadow plane and the movable support plate in the first form position;

DETAILED DESCRIPTION OF THE INVENTION

Figure 1:
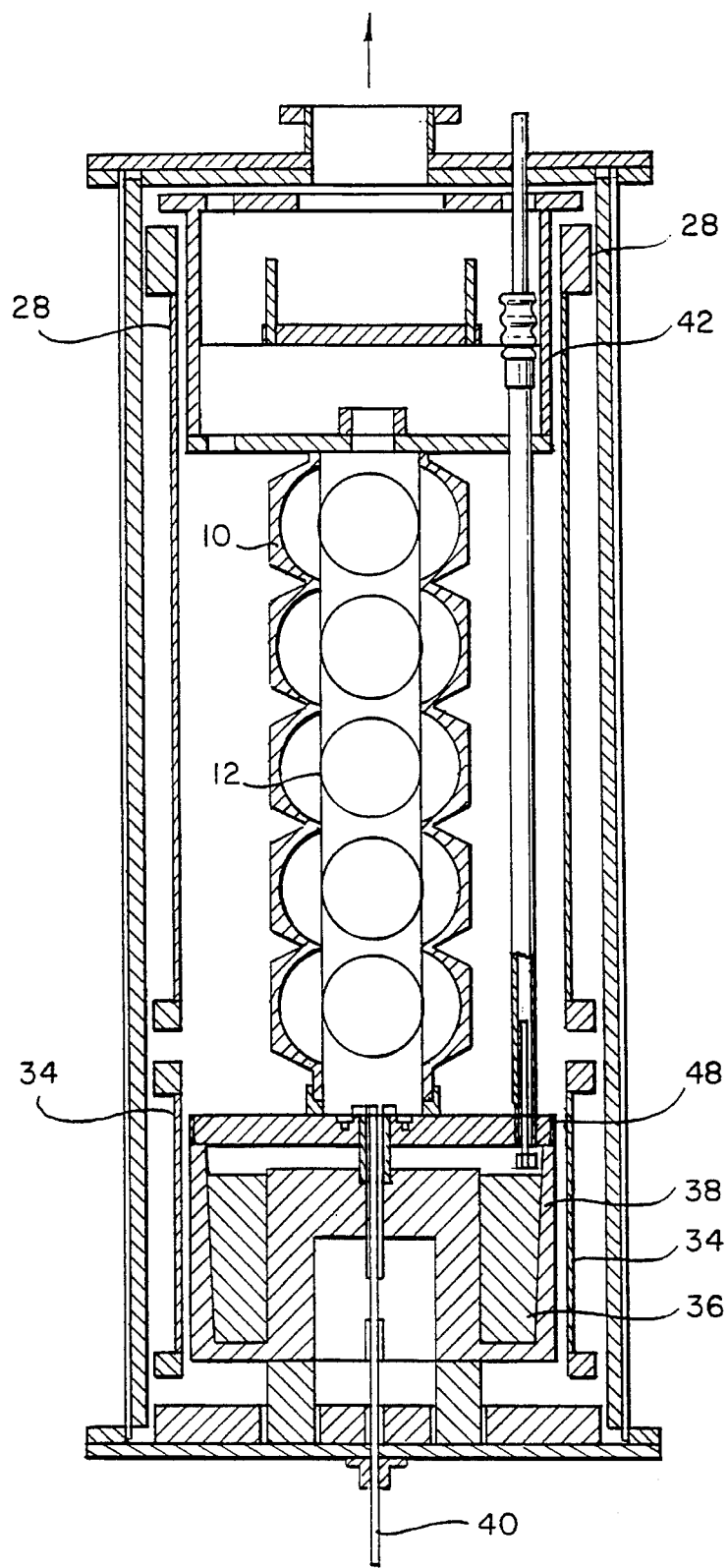
FIG. 1 is a cross-sectional view illustrating a conventional CVD furnace.
Figure 2:
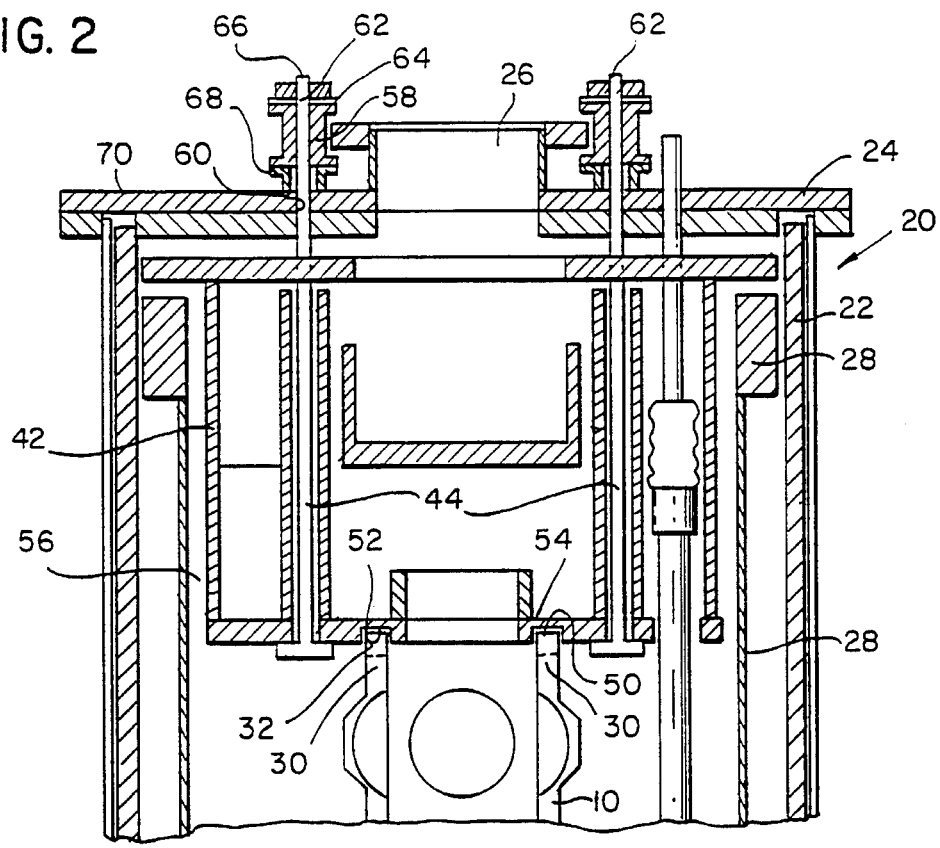
FIG. 2 is a cross-sectional view of the top portion of a CVD furnace illustrating the first embodiment of this invention with a movable support plate in the first form position.
Figure 9:
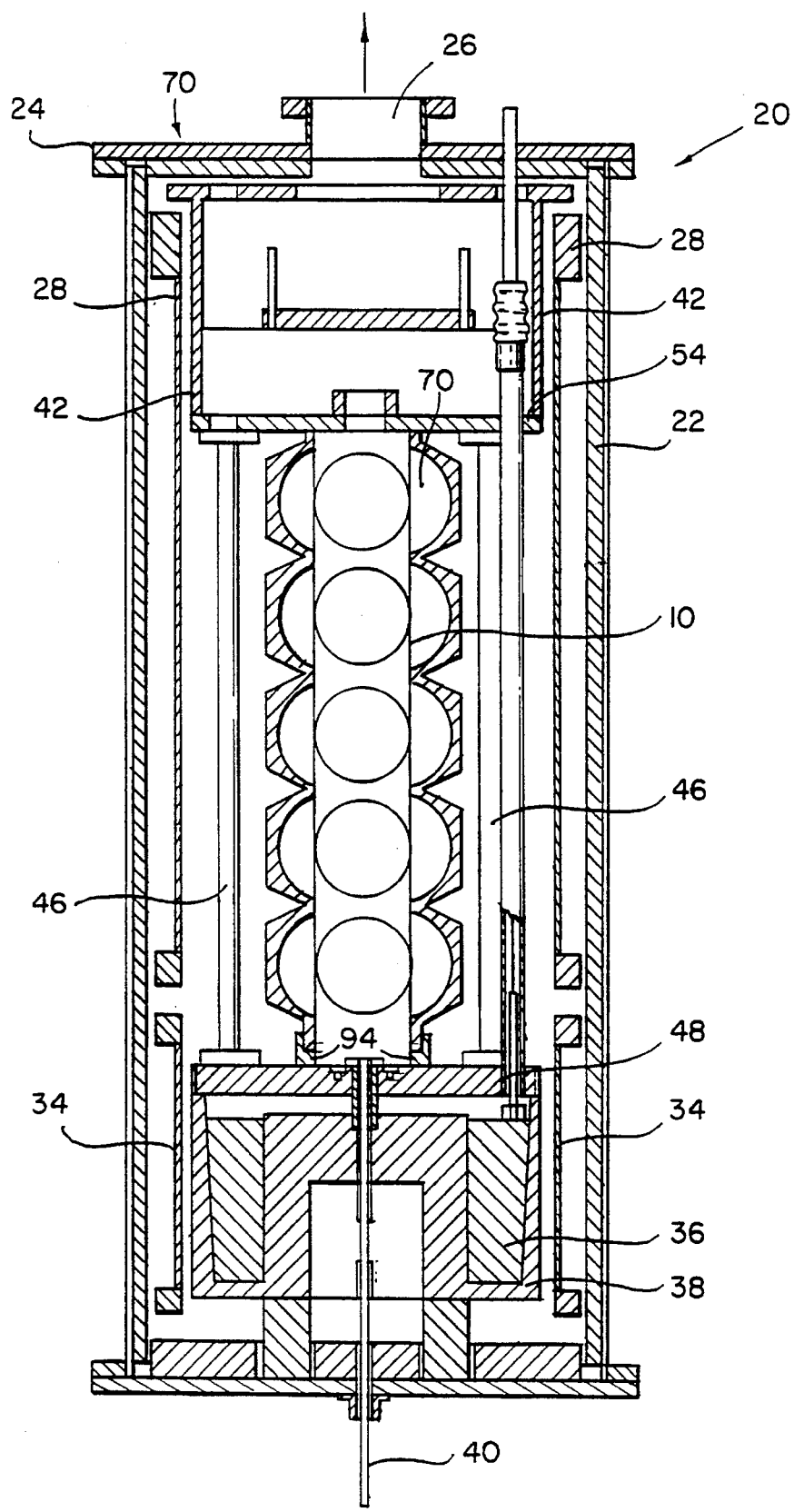
FIG. 9 is a cross-sectional view illustrating a CVD furnace with forms held together with rupturable fasteners.

As best seen in FIG. 2, the top portion of a chemical vapor deposition (CVD) furnace shown generally at 20 is provided for forming a structure by chemical vapor deposition. The chemical vapor deposition furnace 20 for use with this invention includes an insulated outer wall 22 supporting a cover plate 24. The cover plate 24 has an exhaust vent 26 for connecting the furnace 20 to a dust control system (not shown). CVD section heating elements 28 increase the temperature of the CVD furnace 20 and the mandrel plates 10 to operating temperature and maintain the furnace at operating temperature during the CVD process. As the mandrel plates 10 are heated they expand from a first form position 30 to a second form position 32. Retort heating elements 34 as shown in FIGS. 1 and 9, heat zinc metal 36 which is to be deposited, to the melting point and then vaporize the zinc metal 36. The zinc metal 36 is held in a retort 38. Reaction gas, typically either $H_2S$ or $H_2Se$, and an inert carrier gas are fed to the furnace 20 through injector 40. The flow rate of the gas is control by appropriate means known in the art. The flow of reaction gas and an inert carrier gas is initiated when the temperature of the zinc metal 36 has been increased to a specified level wherein the vapor pressure is sufficient to provide a continuous supply of zinc vapor for the CVD process.

An exhaust vapor control system 42 is placed on top of the mandrel plates 10 in a standard CVD furnace 20. For use with this invention the exhaust vapor control system 42 must be supported by other than the mandrel plate 10 so that the mandrel plates are free to move out of the way at the end of the chemical vapor deposition cycle. Therefore, the exhaust vapor control system 42 may be supported by top mounted support rods 44, as shown in FIG. 2, base mounted support rods 46 attached to the mandrel base plate 48, as shown in FIG. 9, or base mounted support rods 46 (not shown) attached to the furnace bottom 48.

In the first embodiment of this invention, as shown in FIG. 2, the top edges 50 of mandrel plates 10 maintained in a first form position 30 and the second form position 32 by channels 52 cut into the bottom plate 54 of the exhaust vapor control system 42. The channels 52 should be cut so that they are approximately 0.25 inch deep and 0.1 inch wider than the thickness of the top edges 50 of mandrel plates 10, and preferably the channels 52 should be cut so that they are approximately 0.05 inch wider than the thickness of the top edges 50 of mandrel plates 10.

Figure 3:
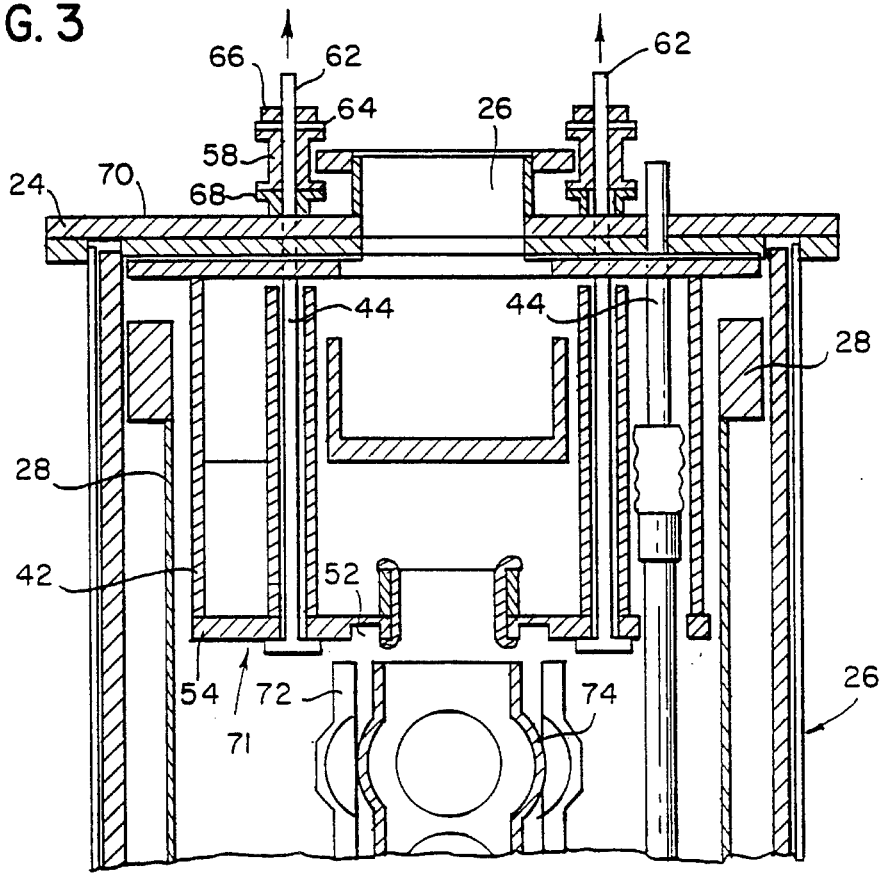
FIG. 3 is a cross-sectional view of the top portion of a CVD furnace illustrating the first embodiment of this invention with a movable support plate and the mandrel plates in the second form position.

The exhaust vapor control system 42 is maintained in a first position 56 by end caps 58 on support rods 44 which pass through apertures 60 in cover plate 24 prior to and during the CVD process. The terminal ends 62 of support rods 44 are held in place by caps 64 secured by nuts 66 or the like fastened to the terminal ends 62 of support rods 44. The end caps 58 rest on support brackets 68 attached to the upper surface 70 of cover plate 24. Support rods 44 are moved in an upward direction by appropriate means when the CVD process is completed, but prior to the cool down of the CVD furnace 20. As the support rods are raised the top edges 50 of mandrel plates 10 are disengaged from channels 52 in the bottom plate 54 as the bottom plate 54 is moved into second position 71. The mandrel plates 10 are then free to move to the third form position 72 as shown in FIG. 3. This movement is from 0.5 to 2 inches and preferably from 0.25 to 0.5 inch. When the mandrel plates 10 are disengaged from the support means, for example channels 52 cut into the bottom plate 54, the mandrel plates 10 will fall away from the CVD deposited material 74 after the support has been removed or after a short period of time.

Figure 5:
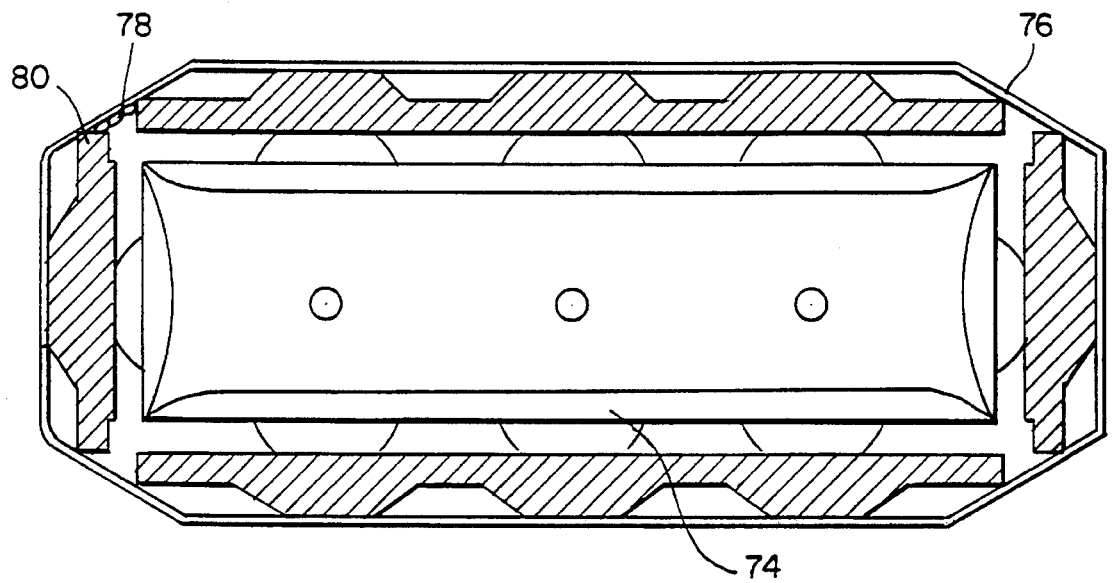
FIG. 5 is a top plan view of the mandrel plates in the second support position with a support band maintaining the mandrel plates in the third form position.

The mandrel plates 10 and the CVD deposited material 74 may not disengage immediately after the support means is removed, however, after the CVD deposited material 74 and the mandrel plates 10 have cooled slightly the contraction of the CVD deposited material 74 will result in the parts being forced apart do to the "pinning" action which is described hereinabove. Once the mandrel plates 10 have disengaged from the CVD deposited material 74 the mandrel plates 10 move to the third form position 72, as shown in FIG. 3. In FIG. 5, the mandrel plates 10 are shown supported in the third form position 72 by a continuous band 76. Also, the mandrel plates can be supported by short chains 78 attached to each of the side edges 80 of the mandrel plates 10. The continuous band 76 and short chains 78 can be made from any appropriate material such as stainless steel or the like. Also, base mounted support rods 46, as shown in FIG. 9 can act as support to maintain the mandrel plates in the third form position 72. It is important that any support means used maintain the mandrel plates 10 a sufficient distance from furnace heating elements 28 to avoid damage to the heating elements 28.

In order that the bottom plate 54 disengages from the CVD deposited material 74 when the bottom plate is raised a false cover or shadow plane 82 should be used so that a large amount of CVD deposited material 74 does not form in the corner 84 formed by the intersection of the bottom plate 54 and the mandrel plates 10. The "shadow plane" consists of a metal or ceramic ring placed a short distance from the bottom of the bottom plate 54 inside the space defined by the mandrel plates 10.

Figure 6:
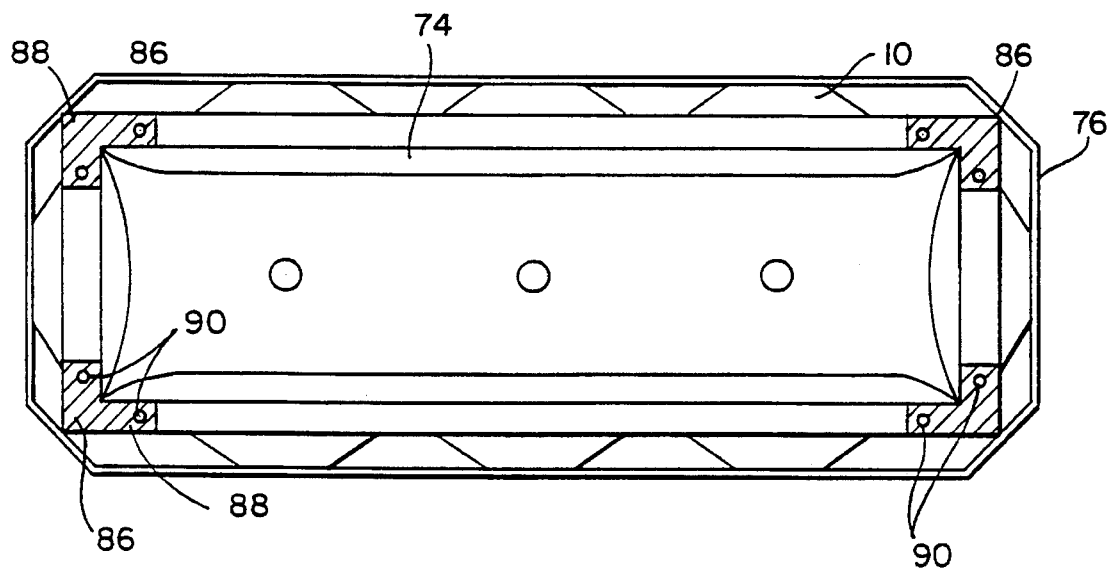
FIG. 6 is a top plan view of the mandrel plates maintained in the first form position by brackets held in place with shear pins.
Figure 7:
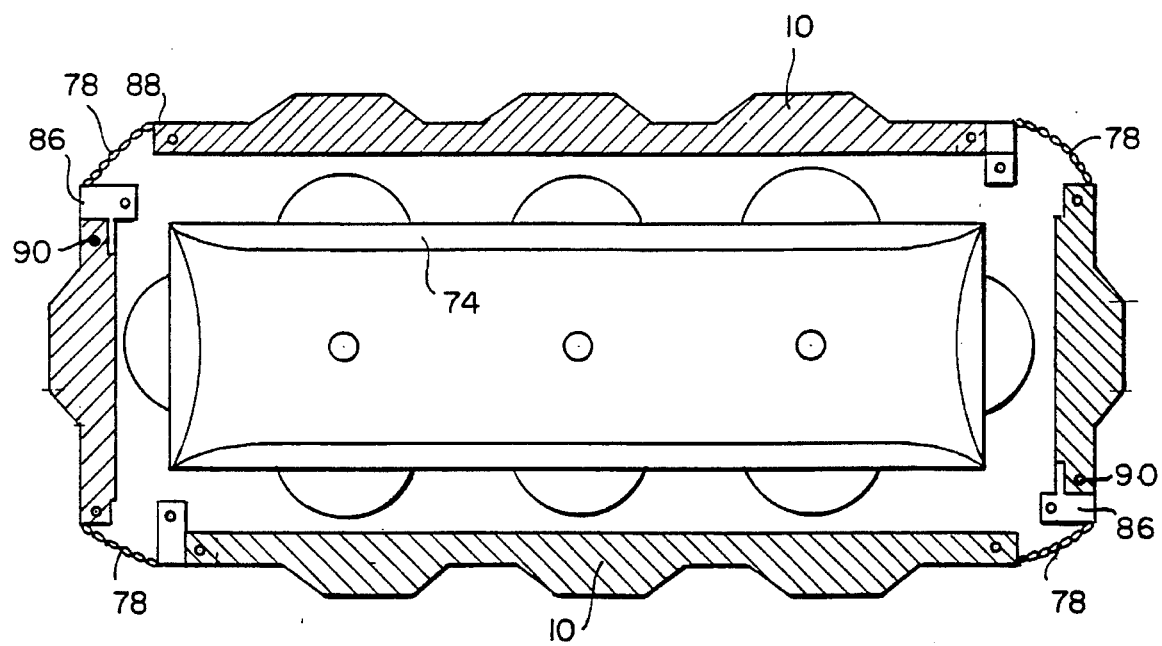
FIG. 7 is a top plan view of the mandrel plates in the second form position after the shear pins have broken due to force caused by thermal stresses during the cooling process.
Figure 8:
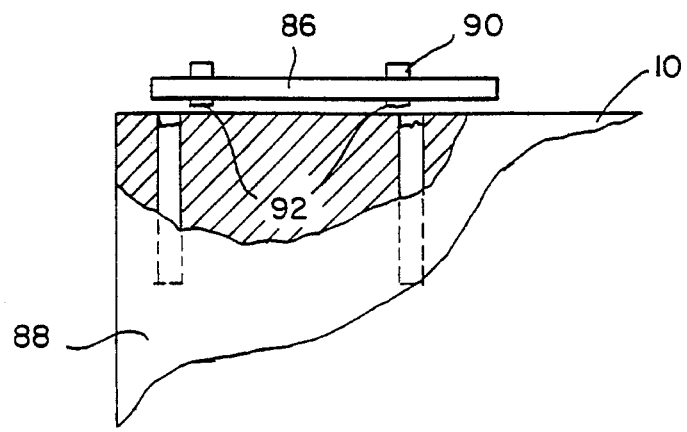
FIG. 8 is a fragmented view of a mandrel plate with shear pins showing the broken shear pins.

In a second embodiment of this invention, as shown in FIG. 6, the top edges 50 of mandrel plates 10 maintained in the first form position 30 and second form position 32 by retention brackets 86 attached to the corners 88 of the mandrel plates 10 by rupturable fastener means 90. The rupturable fastener means remain intact during the heating cycle and the chemical vapor deposition cycle of the CVD process. The rupturable fastener means can be made from graphite or any suitable material which will fracture under the stresses generated by the cooling of the CVD deposited structure. During the cooling phase, the forces generated by the "pinning" effect cause the rupturable fastener means to break 92, as shown in FIG. 8, thereby freeing the mandrel plates 10 to move to the third form position 72, as shown in FIG. 7.

The device and method of this invention are applied to CVD furnaces for the manufacture of multi-site curved surfaces such as domes 12 or the like. The CVD furnace 20 used with this invention is prepared by loading zinc metal 36 into a retort 38 placed at the base of the CVD furnace. The zinc metal 36 can also be supplied by a zinc wire fed to a heated conical retort, as disclosed in copending application Ser. No. 042,933 which was filed at the same time as this application. The application of which is assigned to the assignee of the present application, the disclosure of which application is incorporated herein by reference. A gas injector 40 is located in the central region of the retort 38. Mandrel plates 10 are then loaded into the furnace and are placed on tracks 94 attached to the mandrel base plate 48. As required, the mandrel plates may be held in place temporarily while the bottom plate 54 of the exhaust vapor control system 42 is put into place and the furnace is covered. The removable support means should be engaged at this time.

The furnace is then sealed and connected to the exhaust system (not shown). The CVD region of the furnace and the retort region are heated to operating temperature. During the heating phase, the mandrel plates expand from the first form position to the second form position. The flow of reaction gas and the inert carrier gas; such as helium, neon, argon, krypton, or nitrogen, is initiated. The chemical vapor deposition process is then monitored by appropriate means known in the art. When the chemical vapor deposition process is completed, the furnace is cooled and the removable support means is withdrawn, thereby permitting the mandrel plates to contract without mechanical restriction. The CVD furnace is then opened and the CVD deposited material is removed for inspection and finishing of the final product. With the use of this invention yields, as high as 100% can be achieved.

Thus, in accordance with the invention, there has been provided a method and a device to reduce the stress cracking associated with the difference in the coefficient of thermal expansion (CTE) between the CVD deposited parts and the mandrel plates during the cooling phase of the CVD process. There has also been provided a method and a device to reduce the mechanical stresses placed on the CVD deposited parts by the mandrel plates during the cooling phase of the CVD process. There has also been provided a method and a device to separate the mandrel plates from the CVD deposited parts after deposition and prior to the cooling process while maintaining the CVD furnace at normal operating conditions. Additionally, there has been provided a method and a device to reduce the mechanical stresses on the CVD deposited parts during the cooling process without significant modification to the CVD process or equipment.

With this description of the invention in detail, those skilled in the art will appreciate that modification may be made to the invention without departing from the spirit thereof. Therefore, it is not intended that the scope of the invention be limited to the specific embodiments that have been illustrated and described. Rather, it is intended that the scope to the invention be determined by the scope of the appended claims.

We claim:

1. A method for the manufacture of chemical vapor deposited structures comprising:

placement of a plurality of mandrel plates in a chemical vapor deposition furnace, said mandrel plates made from a material suitable for use in a chemical vapor deposition furnace, said furnace having a plurality of side walls, a top cover and a bottom cover, each of said mandrel plates having a top end, a bottom end, and side edges;

placement of each of said bottom ends of said mandrel plates in a base member, said base member retaining said mandrel plates in a substantially rigid position;

securing each of said mandrel plates with a removable support means which maintains each of said mandrel plates in a first form position;

heating the chemical vapor deposition furnace to the operating temperature, thereby moving said mandrel plates into a second form position due to thermal expansion of the material from which the mandrel plates are manufactured, said second form position being intermediate between said first form position and a third form position;

depositing material on said mandrel plates by chemical vapor deposition;

providing a second support means, wherein said second support means permits limited movement of said top ends of said mandrel plates to a third form position;

at the completion of said deposition said removable support means is removed thus permitting said mandrel plates to move from said second form position to said third form position, such that said mandrel plates are free from said chemical vapor deposited material, thereby permitting said deposited material to contract without mechanical restriction.

2. The method of claim 1 wherein upon securing said top ends of said mandrel plates with a removable support means which maintains each of said mandrel plates in a first form position and a second form position, said side edges of each of said mandrel plates forms are retained in close proximity to one another.

3. The method of claim 1 wherein said removable support means is a movable top plate which moves from a first position securing said top ends in a first form position and a second form position wherein said mandrel plates are retained in close proximity to one another, and a second position which permits said top ends of said mandrel plates to move freely to a third form position.

4. The method of claim 1 wherein said removable support means is a rupturable fastener means which secures said top ends of said mandrel plates in a first form position when said mandrel plates are cool and a second form position when said mandrel plates are heated, wherein said mandrel plates are retained in close proximity to one another, and upon the application of a sufficient amount of force said rupturable fastener means breaks thereby removing said removable support means thereby permitting said top ends of said mandrel plates to move freely to a third mandrel plate position.

5. The method of claim 1 wherein said second support means is a flexible attachment means attached between said first edge and said second edge of corresponding mandrel plates.

6. The method of claim 1 wherein said second support means is a continuous band which encircles said mandrel plates.

7. The method of claim 1 wherein said second support means is a plurality of support posts attached to said base member.

8. The method of claim 7 wherein each of said support posts is attached to said bottom cover of said furnace.

9. A device for the manufacture of chemical vapor deposited structures comprising:

a plurality of mandrel plates in a chemical vapor deposition furnace, said mandrel plates made from a material suitable for use in a chemical vapor deposition furnace, said furnace having a plurality of side walls, a top cover and a bottom cover, each of said mandrel plates having a top end, a bottom end, and side edges;

a base member for placement of said bottom ends of said mandrel plates in said base member retaining said mandrel plates in substantially rigid placement;

a removable means for securing said top ends of said mandrel plates which maintain each of said mandrel plates in a first form position when said mandrel plates are cool and a second form position when said mandrel plates are heated, wherein said side edges of each of said mandrel plates forms are retained in close proximity to one another;

a second support means, wherein said second support means permits limited movement of said top ends of said mandrel plates to a third form position;

wherein, after a structure is deposited by chemical vapor deposition, said removable means for securing said top ends of said mandrel plates is removed thus permitting said mandrel plates to move from said second form position to said third form position, such that said mandrel plates are free from said chemical vapor deposited material, thereby permitting said material to contract without mechanical restriction.

10. The device of claim 9 wherein said removable support means is a movable plate which moves from a first position securing said top ends in a first form position when said mandrel plates are cool and a second form position when said mandrel plates are heated, wherein said mandrel plates are retained in close proximity to one another, and a second position which permits said top ends of said mandrel plates to move freely to a third form position.

11. The device of claim 9 wherein said removable support means is a rupturable fastener means which secures said top ends of said mandrel plates in a first form position when said mandrel plates are cool and a second form position when said mandrel plates are heated, wherein said mandrel plates are retained in close proximity to one another, so that the application of a sufficient amount of force causes said rupturable fastener means to break thereby removing said removable support means thereby permitting said top ends of said mandrel plates to move freely to a third form position.

12. The device of claim 9 wherein said second support means is a flexible attachment means attached between said first edge and said second edge of corresponding mandrel plates.

13. The device of claim 9 wherein said second support means is a continuous band which encircles said mandrel plates.

14. The device of claim 9 wherein said second support means is a plurality of support posts attached to said base member.

* * * * *